United States Patent [19]
Riemer

[11] Patent Number: 4,817,524
[45] Date of Patent: Apr. 4, 1989

[54] SCREEN PRINTING METHOD AND APPARATUS
[75] Inventor: Dietrich E. Riemer, Auburn, Wash.
[73] Assignee: The Boeing Company, Seattle, Wash.
[21] Appl. No.: 947,903
[22] Filed: Dec. 31, 1986
[51] Int. Cl.[4] .............................................. B41F 15/08
[52] U.S. Cl. ..................................... 101/123; 101/129
[58] Field of Search ................ 101/123, 126, 169, 129

[56] References Cited

U.S. PATENT DOCUMENTS

| | | | |
|---|---|---|---|
| 1,911,247 | 5/1933 | Spence | 101/157 |
| 2,534,320 | 12/1950 | Taylor | 101/169 |
| 3,128,207 | 4/1964 | Schmitt | 101/169 |
| 3,143,961 | 8/1964 | Jaffa | 101/123 |
| 3,187,718 | 6/1965 | Coghill | 101/169 |
| 3,730,089 | 5/1973 | McCutcheon | 101/DIG. 24 |
| 3,783,781 | 1/1974 | Grommek | 101/169 |
| 3,964,386 | 6/1976 | Dini | 101/169 |
| 4,122,771 | 10/1978 | Barton | 101/123 |
| 4,446,791 | 5/1984 | Stevens | 101/DIG. 24 |
| 4,463,675 | 8/1984 | Ottenhues | 101/169 |
| 4,589,336 | 5/1986 | Klemm | 101/123 |

FOREIGN PATENT DOCUMENTS

| | | | |
|---|---|---|---|
| 1002828 | 1/1977 | Canada | 101/123 |
| 2317213 | 10/1974 | Fed. Rep. of Germany | 101/169 |
| 2901830 | 8/1979 | Fed. Rep. of Germany | 101/DIG. 24 |
| 3309823 | 10/1983 | Fed. Rep. of Germany | 101/DIG. 24 |
| 3527115 | 2/1986 | Fed. Rep. of Germany | 101/169 |
| 1240568 | 8/1960 | France | 101/123 |
| 2006887 | 1/1970 | France | 101/120 |
| 208113 | 3/1984 | German Democratic Rep. | 101/169 |
| 3917 | 1/1980 | Japan | 101/169 |
| 42047 | 3/1985 | Japan | 101/169 |
| 709961 | 1/1980 | U.S.S.R. | 101/DIG. 24 |
| 1014758 | 4/1983 | U.S.S.R. | 101/169 |
| 3211156 | 10/1983 | U.S.S.R. | 101/169 |
| 825238 | 12/1959 | United Kingdom | 101/123 |

Primary Examiner—Clifford D. Crowder
Attorney, Agent, or Firm—Christensen, O'Connor, Johnson & Kindness

[57] ABSTRACT

A screen printing method and apparatus in which the ink pressure is held constant by varying the squeegee speed and/or the squeegee angle during a print stroke. In one method, the squeegee velocity v and/or squeegee angle α are controlled such that v times the square root of the amount of ink A on the screen before the squeegee, divided by the square of the sine of α, is substantially constant. In another approach, the pressure is directly measured and held constant during the print stroke. The quantity A may be determined as a linear function of the squeegee position during the print stroke. A screen printing apparatus is provided having a squeegee with a planar surface and a contact edge at the lower edge of the planar surface. The squeegee is mounted such that it can be rotated about the contact edge, to thereby vary the squeegee angle without changing the elevation of the contact edge.

13 Claims, 5 Drawing Sheets

SCREEN PRINTING METHOD AND APPARATUS

FIELD OF THE INVENTION

The present invention relates to screen printing for thick film, hybrid electrical circuits, and in particular to an improved method and apparatus for performing the printing operations such that consistent results can be obtained in an automated system.

BACKGROUND OF THE INVENTION

Screen printing is older than the electronics industry, and was initially developed in the first decade of this century out of the even older art of printing with stencils. In a modern screen printing process, a stainless steel screen is positioned on a ceramic or glass substrate, the screen having portions masked such that unmasked areas represent the areas to be printed. A printing ink containing a powder of solid particles is then placed on the screen, and a squeegee is drawn over the screen to force the ink through the unmasked areas of the screen. The screen is then withdrawn, and the ink-coated substrate is fired, leaving a pattern of solid material (e.g., a conductor, dielectric or resistor) on the substrate.

A typical screen printing process may generally be described with reference to FIGS. 1A-1C. In FIG. 1A, reference numeral 12 represents the substrate on which the printing occurs. The printing apparatus includes screen 14 and squeegee 24. Screen 14 includes frame 16 and mesh 18, the mesh comprising a square array of filaments 20. In the cross-sectional view in FIGS. 1A-1C, only those filaments extending into and out of the plane of the drawing are shown. In operation, a quantity of ink 30 is placed on screen 14 at one side of mesh 18, and the squeegee is then drawn across the mesh in a print stroke, as illustrated in FIGS. 1B and 1C. During the print stroke, right hand surface 26 of the squeegee pushes ink 30 across the screen, and the lowermost edge of the squeegee comprises a contact edge 28 that bears against mesh 18. The contact edge locally deforms the mesh such that the mesh is forced down into contact with substrate 12, and the squeegee forces ink 30 to pass through the mesh onto the substrate. The bead or globule of ink 30 bounded by screen 14 and surface 26 of squeegee 24 is referred to herein as the ink "before the squeegee." It should be understood that FIGS. 1A-1C are an exaggerated schematic view, and that the quantity of ink before the squeegee is much larger than the quantity of ink that passes through mesh 18 during a print stroke. Thus for most purposes, the decrease in the volume of the ink before the squeegee during a print stroke due to ink passing through the screen is negligible.

Because the unused ink is moved from one end of the screen to the other during a print stroke, an automated and continuous printing process is not possible unless the ink is returned to its starting position to begin the next print stroke. The ink is usually returned by the so-called flood stroke. During the flood stroke, the squeegee is moved a certain distance above the screen, and then moved back to its starting position to begin the next print stroke. During the flood stroke, a film of ink having a thickness approximately equal to the distance of the squeegee from the screen during the subsequent flood stroke is left on the screen. Thus, when the squeegee moves through the subsequent print stroke, the amount of ink before the squeegee increases as the flood deposit is scraped off the screen by the squeegee.

To date, screen printing has been treated as an art, without any mathematical definition or correlation of the printing parameters with printing results. In particular, printing conditions are generally established based on empirical results or operator skill or experience. Because of the unavailability of generally applicable models of the printing process, screen printing machines are typically designed to hold the squeegee speed and squeegee angle constant during a printing stroke, in an attempt to achieve consistent printing conditions. However, as described above, at least one parameter, the amount of ink before the squeegee, may change during a print stroke. The result is that printing conditions are not in fact kept constant during a print stroke, in spite of the constant machine conditions.

For many applications, the above considerations have resulted in the abandonment of the use of a continuous process for screen printing. In particular, for high accuracy applications, the flooding of the screen during the flood stroke is avoided. Instead, an operator manually picks up the ink at the end of the print stroke with a spatula, and places the ink as a bead before the squeegee at the other end of the screen. With this procedure, although cumbersome and not suitable for automation, the printing results do not change significantly during the long print strokes required for large substrates, because the squeegee moves an almost constant amount of ink during each printing stroke.

SUMMARY OF THE INVENTION

The present invention provides a method and apparatus for screen printing that are suitable for automation, and that are capable of achieving consistent results from one end of a print stroke to the other, and between successive print strokes. The basis of the invention is the control of parameters such as squeegee speed and squeegee angle, such that the pressure tending to force the ink through the screen is substantially constant.

One preferred embodiment of the method of the present invention is applicable to a screen printing method for applying an ink to a substrate by placing a screen over the substrate, drawing a squeegee that includes a contact edge over the screen in a flood stroke such that a layer of ink is deposited on the screen, and then drawing the squeegee over the screen in a print stroke with the contact edge in contact with the screen such that ink is forced through the screen onto the substrate. The improvement represented by the present invention comprises controlling the squeegee velocity v and the squeegee angle $\alpha$ during the print stroke such that pressure in the ink adjacent to the contact edge, determined as a function of the squeegee velocity v, the amount of ink on the screen before the squeegee A, and the squeegee angle $\alpha$, is substantially constant. In a preferred embodiment, the pressure is determined as v times the square root of A divided by the square of the sine of $\alpha$. The pressure may be held substantially constant by varying the squeegee velocity v and/or the squeegee angle $\alpha$ during the print stroke. The value of A may be determined by the equation:

$$A = a_1 x + a_2$$

where $a_1$ represents the quantity of ink per unit area deposited on the screen during the flood stroke, $a_2$ represents the quantity of ink at the beginning of the print stroke, and x represents the squeegee position along the print stroke. In another embodiment, the method comprises measuring the pressure of the ink adjacent to the contact edge, and controlling the squeegee velocity v and the squeegee angle α during the print stroke such that the pressure is substantially constant. As with the prior embodiment, the pressure may be held substantially constant by varying the squeegee velocity v and/or the squeegee angle during the print stroke.

DETAILED DESCRIPTION OF THE INVENTION

In order to control the screen printing process by controlling certain parameters, it is first necessary to have a model that relates such parameters to printing results. Thus what is required is a model for the hydrodynamics of the printing ink. The basic equation of motion for the ink is given by the Navier-Stokes equation:

$$F - \text{grad } p + \mu \Delta V = \rho (dV/dt) \quad (1)$$

where F represents forces proportional to the mass of each fluid particle in a force field, grad p is the gradient vector of the pressure field, $\mu$ is the fluid viscosity, $\rho$ is the fluid density, and V is the ink velocity.

Although general solutions to the Navier-Stokes equation do not exist, solutions are available when certain simplifying assumptions are made. The most common simplification is obtained when viscosity is disregarded, and the flow of an ideal fluid is concerned. A second, less familiar simplification is obtained for creeping flow when the viscosity is so large that forces acting on the fluid mass due to gravity and inertia are negligible compared with surface stresses due to viscosity and pressure. This assumption leads to the following equation:

$$\text{grad } p - \mu \Delta V = 0 \quad (2)$$

that will be referred to herein as the Stokes approximation.

Screen printing is identified by a high-flow condition consisting of a plane moving against a high viscosity fluid resting on a horizontal surface. The ink, taken from a condition of rest to one of motion, is accelerated by the moving plane (squeegee) through forces transmitted via the intermediary of hydraulic pressure. The solution of equation (2) for creeping flow in a corner with one moving and one fixed plane is known as the Taylor solution, and is given in polar coordinates (r,ψ) by:

$$\psi_s = rv(B \sin \psi + C\psi \cos \psi + D\psi \sin \psi) \quad (3)$$

where $\psi_s$ is the streamline function, B, C and D are functions of the angle between the planes (the squeegee angle), and v is the velocity of the moving plane (squeegee). Streamlines are envelopes of flow not transgressed by fluid. The value of the streamline function $\psi_s$ is equal to the flow in the streamline enclosure between the streamline and the external boundary formed by the plates. Its units are area/second for the two-dimensional case to be considered.

Figure 1A:
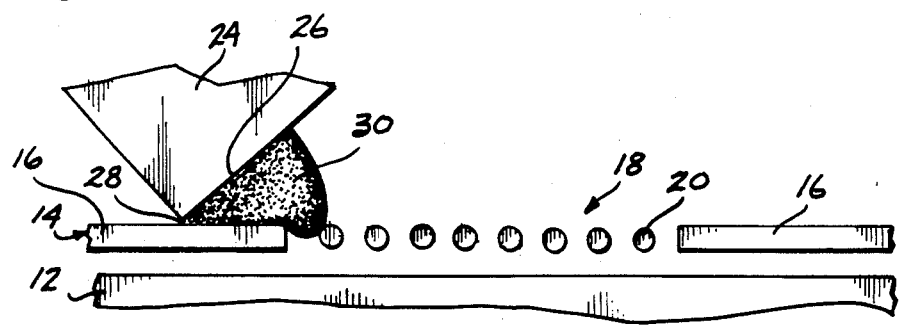
FIGS. 1A, 1B and 1C schematically illustrate a known screen printing process.
Figure 1B:
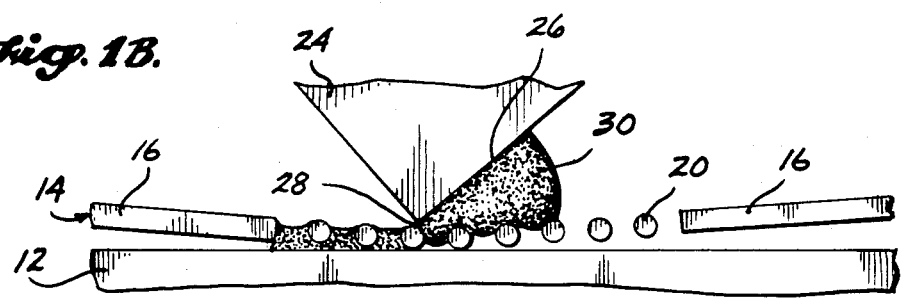
Figure 1C:
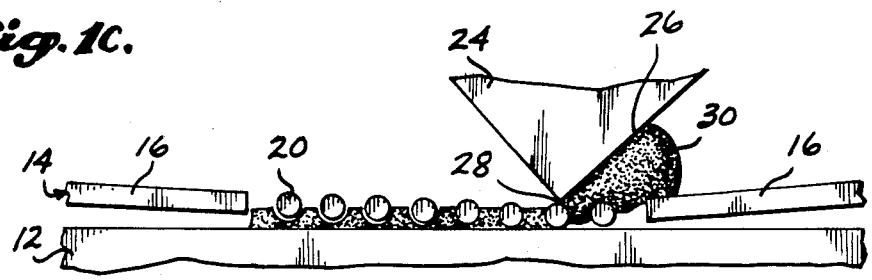
Figure 2:
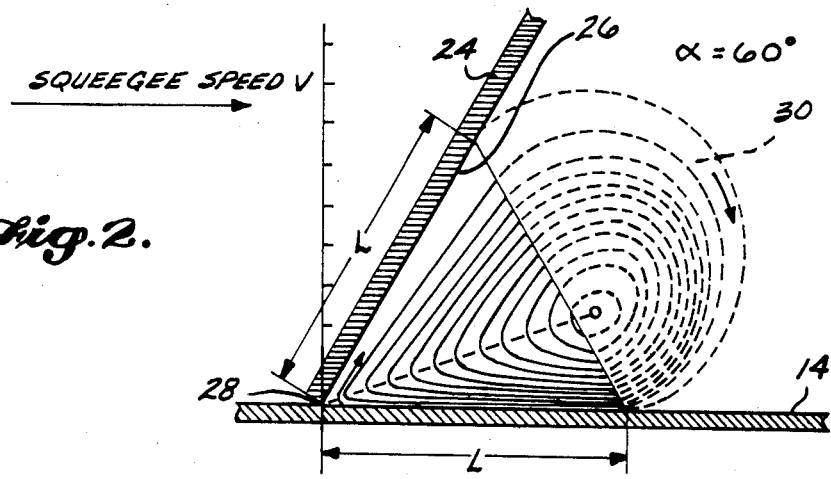
FIGS. 2, 3 and 4 are graphs showing ink streamlines for squeegee angles of 60°, 45° and 30°, respectively.
Figure 3:
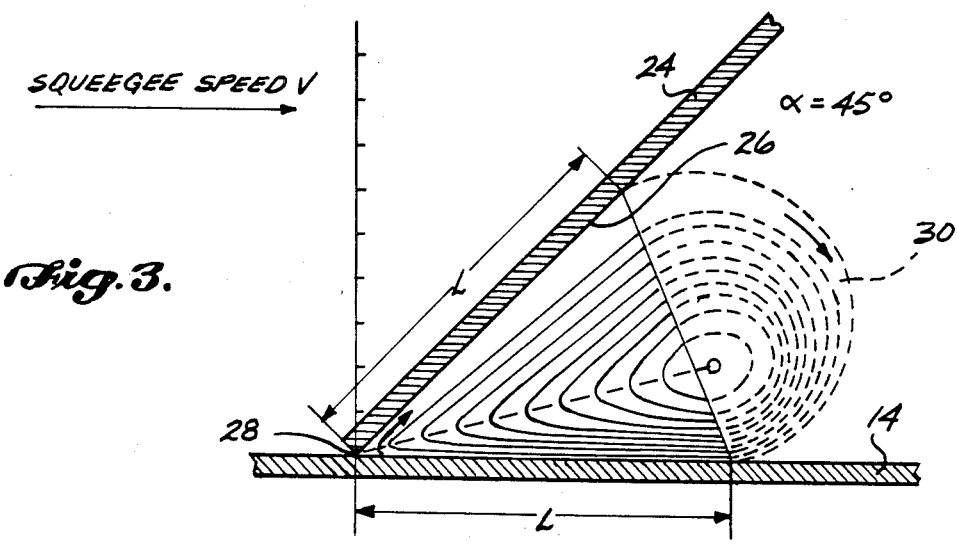
Figure 4:
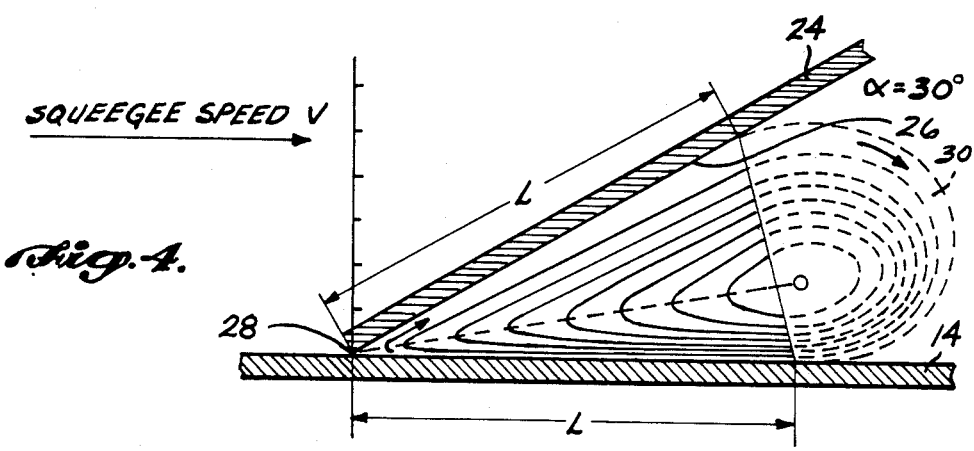

The streamlines specified by Equation (3), for a given squeegee ange, can be produced by applying a straightforward iterative computer technique to Equation (3), to produce streamline graphs such as the ones shown in FIGS. 2-4 for squeegee angles (α) of 60°, 45° and 30°, respectively. In these Figures, reference numerals 14, 24, 26, 28 and 30 have the same meanings as in FIGS. 1A-1C, and the assumed quantity of ink is the same for each of FIGS. 2-4. The theoretical flow is independent of viscosity, as long as the conditions for the Stokes approximation are met. Since mass cannot be created or destroyed, the mass rate of flow past all successive cross sections of a stream tube (channel between streamlines in the two-dimensional case) is constant. Thus the velocity of flow varies inversely with the cross-sectional area of a stream tube, or with the distance between streamlines in the two-dimensional case. Close streamlines therefore imply high velocity. The direction of the velocity of each fluid particle is parallel to the streamlines. FIGS. 2-4 illustrate that the ink slides up on the front edge of the squeegee until the ink comes to the edge of the volume confined between squeegee and screen. The ink then looses contact with the squeegee surface, and is pulled by gravity back towards the screen. This causes the formation of a roll of ink as shown in the solid line portions of FIGS. 2-4. The dashed line portions of FIGS. 2-4 are empirical additions to the theoretical flow pattern, and have negligible effect on the results obtained below.

An important function of moving ink over the screen with the squeegee is the generation of hydraulic pressure of sufficient magnitude to pump the ink through the openings of the screen. In FIGS. 2-4, the space between the squeegee and the first streamline can be treated as a channel with ink flowing through it. The hydraulic pressure developing adjacent contact edge 28 in the corner between surface 26 and screen 14 and the first streamline must become sufficiently high to push the ink through this channel to achieve the indicated flow pattern. This is comparable to the concept that hydraulic pressure generated by the movement of a piston against a fixed plate is determined by the resistance opposing the exit of the fluid contained between piston and plate. The exit resistance of the first streamline channel between squeegee and first streamline, and with it the hydraulic pressure produced in the corner between surface 26 and screen 14, can be determined by the following known formula for the viscous flow of fluid between two flat plates:

$$P_1 - P_2 \approx \mu QL/w^3 \quad (4)$$

where $P_1$ and $P_2$ are the hydraulic pressures, $\mu$ is the ink viscosity, Q is the quantity of ink flowing through the channel, L is the length of the channel, and w is the width of the channel. This formula is correct if both flat plates are at rest, and can be used as an approximation when one plate is moving, because a numerical calculation of actual pressures is not intended. The pressure necessary to inject the ink along the first stream channel from the corner against the atmospheric pressure existing at the point where the ink separates from the squeegee, as given by Equation (4), can be converted into an expression useful for the analysis of screen printing parameters by applying certain geometric relations. In particular, if the amount of ink before the squeegee is assumed to be proportional to the area of the triangle formed by contact edge 28 and the two separation points between ink and squeegee and ink and screen, then the ink volume A is given by:

$$A = \frac{L^2 \sin\alpha}{2} \quad (5)$$

where L is the distance between contact edge 28 and the separation points and $\alpha$ is the squeegee angle between surface 26 and screen 14. This equation can be used to find an expression for a length L of the exit channel:

$$L = \sqrt{\frac{2A}{\sin\alpha}} \quad (6)$$

Analysis of the graphs shown in FIGS. 2-4 indicates that the mean width of the first stream channel at the squeegee surface is proportional to $\sqrt{\sin\alpha}$. Introducing this expression and Equation (5) into Equation (4) results in the following expression correlating the hydraulic pressure p in the ink before the squeegee to screen printing parameters:

$$p \simeq \mu v \frac{\sqrt{A}}{(\sin\alpha)^2} \quad (7)$$

Thus the pressure is proportional to the square root of the ink volume, and inversely proportional to the square of the sine of the squeegee angle. To maintain consistent printing conditions, the hydraulic pressure p must be held constant during each print stroke, and if desired from print stroke to print stroke.

As indicated previously, during continuous or automated screen printing operations, a flood stroke is used between print strokes to return the squeegee and ink to their starting positions. As a result of this flood stroke, a layer of ink is left on the screen. Thus during the ensuing print stroke, the quantity of ink before the squeegee increases from the beginning of the print stroke to the end of the print stroke. This conclusion assumes that the quantity of ink left by the flood stroke is greater than the quantity of ink forced through the screen during the print stroke, an assumption which is virtually always true. Equation (7) indicates that when the quantity of ink before the squeegee changes, the hydraulic pressure of the ink changes, thus leading to varying conditions during a print stroke.

Figure 5:
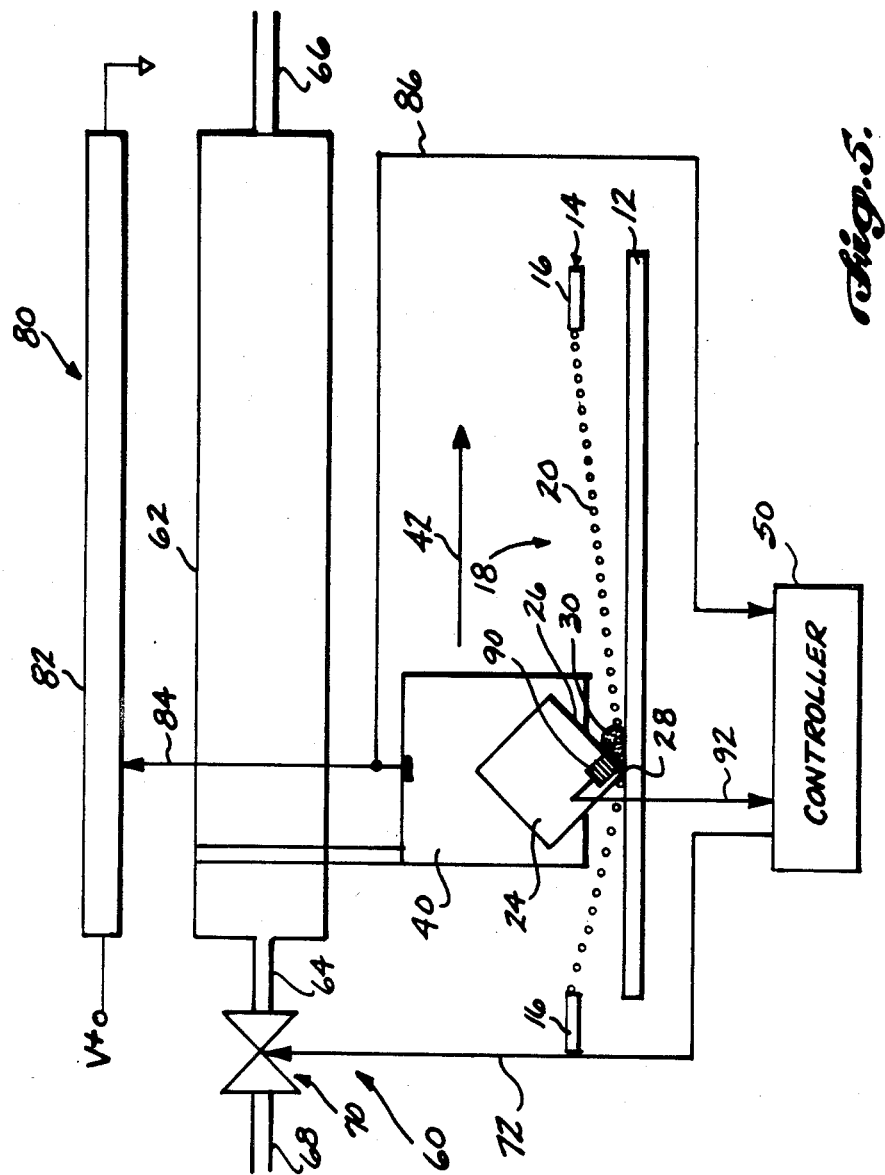
FIG. 5 is a schematic diagram of an apparatus for screen printing according to the present invention.

In accordance with the present invention, screen printing is accomplished such that the hydraulic pressure in the ink before the squeegee is maintained substantially constant during a print stroke. A suitable apparatus for accomplishing this result is shown in FIG. 5, wherein the reference numerals used in FIGS. 1A-1C are used again for similar parts. Thus FIG. 5 schematically shows a screen printing apparatus for printing on substrate 12 by means of screen 14 and squeegee 24. The screen includes frame 16 and mesh 18 that includes a square array of filaments 20. Squeegee 24 has a square cross section, and is mounted in squeegee holder 40, such that the squeegee angle is 45°. The squeegee holder is mounted by conventional means such that it can move back and forth over screen 16 and substrate 12. During the print stroke, the squeegee and squeegee holder move in the direction indicated by arrow 42, with contact edge 28 vertically positioned such that it presses mesh 18 against substrate 12 at the point of contact between squeegee and mesh. When a print stroke has been completed, the squeegee is lifted upward a predetermined distance, and then moved from right to left in a flood stroke until the squeegee has returned to its start position, whereupon the squeegee is lowered and a new print stroke may be commenced.

The printing apparatus shown in FIG. 5 includes controller 50, hydraulic system 60 for controlling the squeegee velocity, and position feedback system 80 for measuring the squeegee position. Hydraulic system 60 includes hydraulic cylinder 62 having ports 64 and 66. Port 66 may be vented to a low pressure reservoir, while port 64 is connected to high pressure line 68 through hydraulic valve 70. The hydraulic valve is controlled by a speed signal on line 72 from controller 50.

Position feedback system 80 is illustrated as a slide contact system comprising resistor 82 and wiper 84 that is mechanically coupled to squeegee holder 40. Resistor 82 is connected between a positive voltage supply and ground, and the resulting voltage level on wiper 84 is sensed by controller 50 via line 86. Optionally, pressure sensor 90 is positioned within squeegee 24, and includes a pressure measuring port opening at the lower end of surface 26 adjacent contact edge 28, such that pressure sensor responds to the hydraulic pressure in ink 30 adjacent the corner between surface 26 and mesh 18. A pressure signal representing the sensed pressure is conveyed to controller 50 via line 92.

In one technique according to the present invention, controller 50 continuously samples the pressure signal on line 92 to monitor the hydraulic pressure in the ink, and controls the squeegee speed via valve 70 so as to maintain constant pressure during a print stroke, and/or between different print strokes. In a second embodiment, controller 50 continuously samples the position signal on line 86 to derive a measurement of the squeegee position and speed, and uses such measurement to control hydraulic valve 70 so as to produce a predetermined speed profile during the print stroke to maintain constant hydraulic pressure. In particular, if the print stroke has been preceded by a flood stroke, it may be assumed that the volume of ink before the squeegee A in Equation (7) is given by:

$$A = a_1 x + a_2 \quad (8)$$

where $a_1$ represents the quantity of ink deposited on the screen during the flood stroke, $a_2$ represents the quantity of ink at the beginning of the print stroke, and x is the squeegee position. Equations (7) and (8) can readily be combined to give:

$$v = \frac{k}{a_1 x + a_2} \quad (9)$$

where k is a constant that is a function of the squeegee angle. Thus measurement of position x via position feedback system 80 can be used to control squeegee speed via Equation (9) to produce constant hydraulic pressure during a print stroke.

Figure 6:
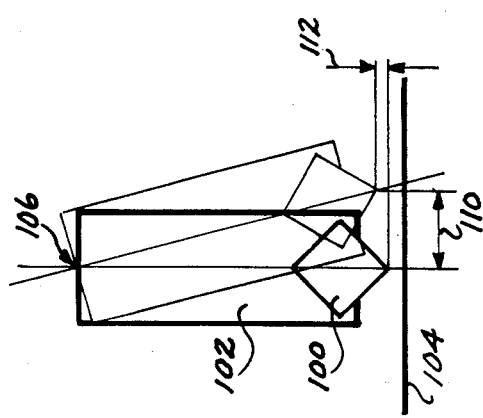
FIG. 6 is a diagram showing a prior art technique for adjusting the squeegee angle.

Equation (7) indicates that the hydraulic pressure in the ink is a function of both squeegee speed and squeegee angle. Some prior screen printers have permitted adjustment of the squeegee angle between print strokes. However, the manner in which such adjustments have been made has had the result of introducing uncertainties into the screen printing process. In particular, FIG. 6 shows an arrangement known in the prior art for adjusting the squeegee angle. In this arrangement, squeegee 100 is secured in squeegee holder 102 above substrate 104. The squeegee holder is mounted such that it can rotate about point 106 to thereby change the squeegee angle. However, as shown in FIG. 6, such rotation is accompanied both by a shift in the squeegee travel distance, indicated by reference numeral 110, as well as by a change in the height of the squeegee above the substrate, indicated by reference numeral 112. The change in squeegee travel and height must of course be accommodated by corresponding adjustments to the print stroke.

Figure 7C:
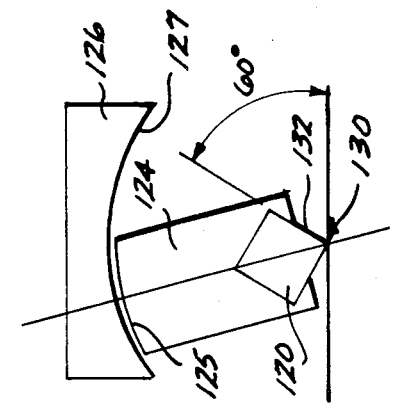
FIGS. 7A, 7B, and 7C are schematic diagrams illustrating an apparatus of the present invention for adjusting squeegee angle.
Figure 7B:
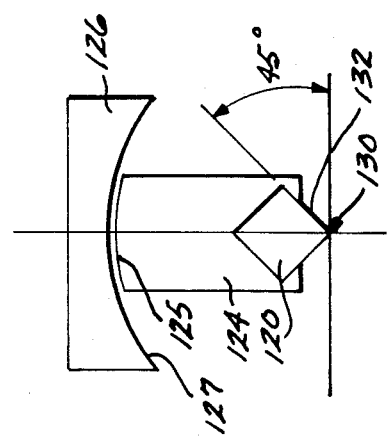
Figure 7A:
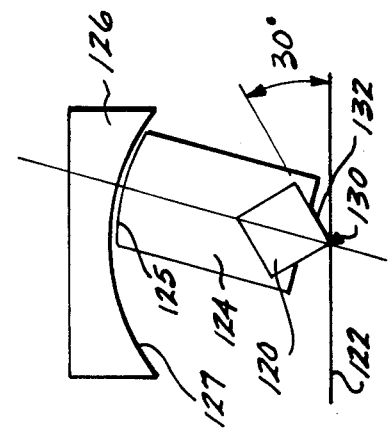

FIGS. 7A–7C illustrate a preferred arrangement for adjusting the squeegee angle in accordance with the present invention. As shown in FIG. 7A, squeegee 120 having contact edge 130 and surface 132 is mounted in squeegee holder 124, that in turn is mounted to frame 126. The lower surface 127 of frame 126, and upper surface 125 of squeegee holder 124, have arcuate shapes such that the squeegee holder and squeegee can rotate about contact edge 130, the contact edge being the point of contact between the squeegee and underlying screen. The mounting of squeegee holder 124 to frame 126 may be accomplished by any suitable mechanism that permits the squeegee to rotate about the contact edge and to be held in place at a particular squeegee angle. For example, frame 126 may include an arcuate groove that is concentric with surfaces 125 and 127 with respect to contact edge 130, and the squeegee holder may include upwardly extending arms that slide in such arcuate grooves. Adjustment of the squeegee angle is carried out as shown in FIGS. 7B and 7C, with the assumed squeegee motion during a print stroke being from left to right, thus producing the illustrated squeegee angles of 30°, 45° and 60°.

Figure 8:
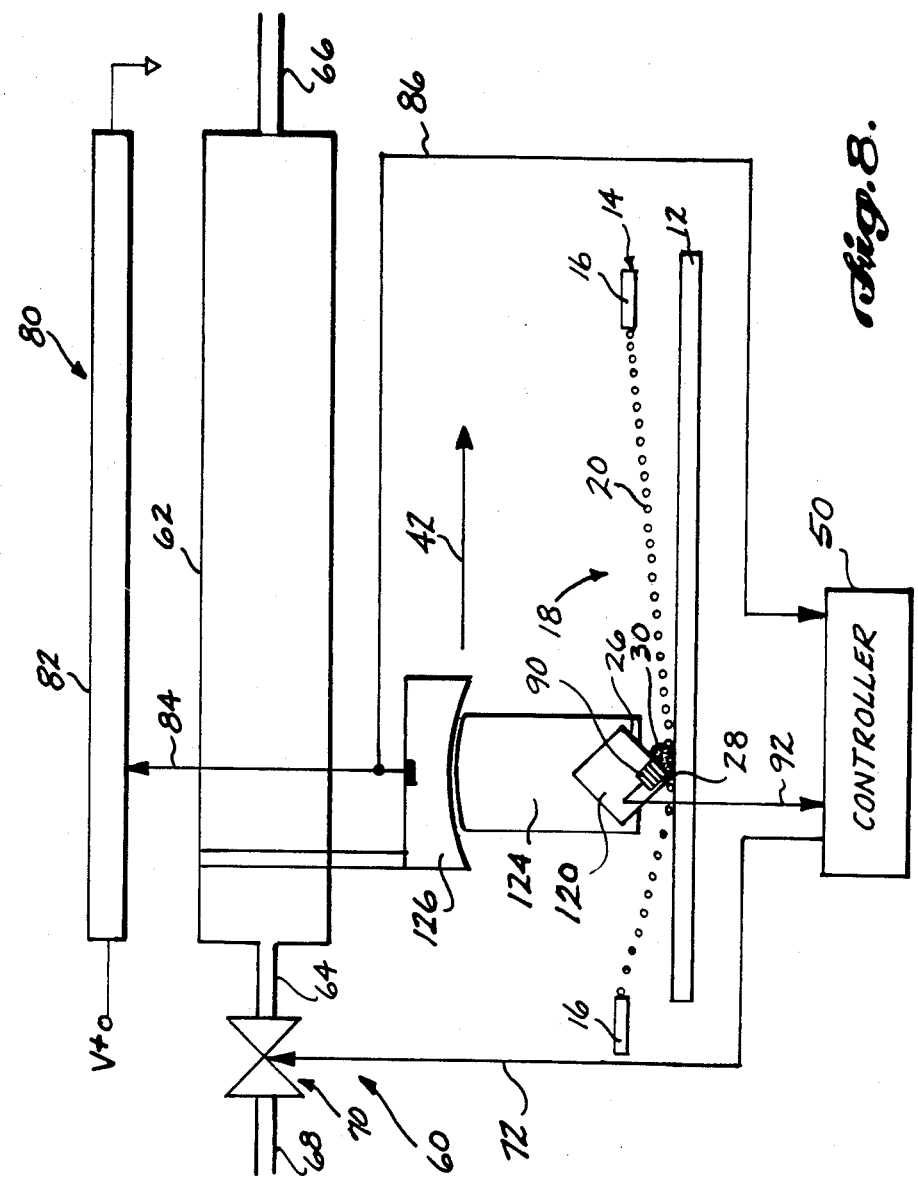
FIG. 8 is a schematic diagram of a second preferred screen printing apparatus according to the present invention.

In the arrangements shown in FIGS. 7A–7C, there is no change in either the squeegee distance of travel, nor of the height of the lowermost tip of the squeegee above the screen and substrate. Thus, the effect of a change in the squeegee angle on the hydraulic pressure in the ink can be reliably determined by Equation (7), giving the operator precise means of control over the screen printing process. This control may be used by adjusting the squeegee angle during printer setup, or between print strokes, to obtain the desired print results. Furthermore, the squeegee angle adjustment mechanism of FIGS. 7A–7C may be utilized in a control system of the type illustrated in FIG. 8. The FIG. 8 control system is similar to that shown in FIG. 5, except that in the embodiment of FIG. 8 both the squeegee velocity and the squeegee angle can be controlled during a print stroke to assure that the hydraulic pressure remains constant during the print stroke.

While the preferred embodiments of the invention have been illustrated and described, variations will be apparent to those skilled in the art. Accordingly, the invention is not to be limited to the specific embodiments described, and the true scope and spirit of the invention are to be determined by reference to the following claims.

The embodiments of the invention in which an exclusive property or privilege is claimed are defined as follows:

1. In a screen printing method for applying an ink to a substrate by placing a screen over the substrate, drawing a squeegee having a contact edge over the screen in a flood stroke such that a layer of ink is deposited on the screen, and then drawing the squeegee over the screen in a print stroke with the contact edge in contact with the screen such that ink is forced through the screen onto the substrate, the improvement comprising controlling the squeegee velocity v and the squeegee angle $\alpha$ during the print stroke such that pressure in the ink adjacent to the contact edge, determined as a function of the squeegee velocity v, the amount of ink on the screen before the squeegee A, and the squeegee angle $\alpha$, is substantially constant.

2. The improvement of claim 1, wherein the pressure is determined as v times the square root of A divided by the square of the sine of $\alpha$, and wherein the pressure is held substantially constant during the print stroke by varying the squeegee velocity v during the print stroke.

3. The improvement of claim 1, wherein the pressure is determined as v times the square root of A divided by the square of the sine of $\alpha$, and wherein the pressure is held substantially constant during the print stroke by varying the squeegee angle $\alpha$ during the print stroke.

4. The improvement of claim 1, wherein the pressure is determined as v times the square root of A divided by the square of the sine of $\alpha$, and wherein the pressure is held substantially constant during the print stroke by varying the squeegee velocity v and the squeegee angle $\alpha$ during the print stroke.

5. The improvement of claims 1, 2, 3 or 4 wherein the quantity A is determined by measuring the position of the squeegee during the print stroke and determining A as:

$$A = a_1 x + a_2$$

where $a_1$ represents the quantity of ink per unit area deposited on the screen during the flood stroke, $a_2$ represents the quantity of ink at the beginning of the print stroke, and x represents the squeegee position along the print stroke.

6. In a screen printing method for applying an ink to a substrate by placing a screen over the substrate, drawing a squeegee having a contact edge over the screen in a flood stroke such that a layer of ink is deposited on the screen, and then drawing the squeegee over the screen in a print stroke with the contact edge in contact with the screen such that ink is forced through the screen onto the substrate, the improvement comprising:
   measuring the pressure of the ink adjacent to the contact edge; and
   controlling the squeegee velocity v and the squeegee angle $\alpha$ during the print stroke such that said pressure is substantially constant.

7. The improvement of claim 6, wherein the pressure is held substantially constant during the print stroke by varying the velocity v during the print stroke.

8. The improvement of claim 6, wherein the pressure is held substantially constant during the print stroke by varying the squeegee angle α during the print stroke.

9. The improvement of claim 6, wherein the pressure is held substantially constant during the print stroke by varying the velocity v and the squeegee angle α during the print stroke.

10. In a screen printing apparatus comprising a squeegee having a contact edge and including means for applying an ink to a substrate by placing a screen over the substrate, drawing the squeegee over the screen in a flood stroke such that a layer of ink is deposited on the screen, and then drawing the squeegee over the screen in a print stroke with the contact edge in contact with the screen such that ink is forced through the screen onto the substrate, the improvement comprising control means for controlling the squeegee velocity v and the squeegee angle α during the print stroke such that pressure in the ink adjacent to the contact edge, determined as a function of the squeegee velocity v, the amount of ink on the screen before the squeegee A, and the squeegee angle α, is substantially constant.

11. The improvement of claim 10, wherein the control means comprises position transducer menas for measuring the squeegee position during the print stroke and for producing a corresponding position signal, controller means including means for receiving the position signal and producing a corresponding speed signal, and velocity control means including means for receiving the speed signal and means for controlling the squeegee speed in response to the speed signal, the controller including means for producing the speed signal such that the pressure is substantially constant during the print stroke.

12. The improvement of claim 11, wherein the controller means includes means for determining A as:

$$A = a_1 x + a_2$$

where $a_1$ represents the quantity of ink per unit area deposited on the screen during the flood stroke, $a_2$ represents the quantity of ink at the beginning of the print stroke, and x represents the squeegee position along the print stroke as determined from the position signal.

13. The improvement of claim 10, wherein the control means comprises pressure transducer means for measuring the pressure of the ink adjacent to the point of contact between the squeegee and the screen during the print stroke and for producing a corresponding pressure signal, controller means including means for receiving the pressure signal and producing a corresponding speed signal, and velocity control means including means for receiving the speed signal and means for controlling the squeegee speed in response to the speed signal, the controller including means for producing the speed signal such that the pressure is substantially constant during the print stroke.

* * * * *

UNITED STATES PATENT AND TRADEMARK OFFICE
CERTIFICATE OF CORRECTION

PATENT NO. : 4,817,524            Page 1 of 2

DATED : April 4, 1989

INVENTOR(S) : D. E. Riemer

It is certified that error appears in the above-identified patent and that said Letters Patent is hereby corrected as shown below: Title Page:

Under "References Cited, U.S. Patent Documents", insert:

| | | |
|---|---|---|
| --2,415,644 | 02/1947 | Leonhard et al. |
| 2,528,573 | 11/1950 | Beugler |
| 2,830,555 | 04/1958 | Barrett |
| 3,130,303 | 04/1964 | Dobbins |
| 3,356,062 | 12/1967 | Crowe |
| 3,453,137 | 07/1969 | Penkala et al. |
| 3,483,819 | 12/1969 | Hughes, Jr. |
| 3,642,181 | 02/1972 | Thomas et al. |
| 3,697,302 | 10/1972 | Ihara et al. |
| 3,831,616 | 08/1974 | Weyers |
| 3,924,529 | 12/1975 | Atkinson |
| 4,251,566 | 02/1981 | Gingerich |
| 4,330,354 | 05/1982 | Deubner |
| 4,387,663 | 06/1983 | Alheid |
| 4,493,286 | 01/1985 | Carson |
| 4,554,887 | 11/1985 | Yoakam et al.-- |

Column 3, line 9:      after "angle" insert -- $\alpha$ --

Column 3, lines 36-38:      "p(dV/dt)" should be -- $p\frac{dV}{dt}$ --

UNITED STATES PATENT AND TRADEMARK OFFICE
CERTIFICATE OF CORRECTION

PATENT NO. : 4,817,524

DATED : April 4, 1989

INVENTOR(S) : D. E. Riemer

It is certified that error appears in the above-identified patent and that said Letters Patent is hereby corrected as shown below:

Column 4, line 14: "ange" should be --angle--

Column 4, lines 62-64: "$\approx \mu QL/w^3$" should be --$\approx \dfrac{\mu QL}{w^3}$--

Column 9, line 24: "menas" should be --means--

Signed and Sealed this

Nineteenth Day of June, 1990

Attest:

HARRY F. MANBECK, JR.

*Attesting Officer*     *Commissioner of Patents and Trademarks*